US007572677B2

(12) United States Patent  (10) Patent No.: US 7,572,677 B2
Chiu et al.  (45) Date of Patent: Aug. 11, 2009

(54) ARRANGEMENT IN SEMICONDUCTOR PACKAGES FOR INHIBITING ADHESION OF LID TO SUBSTRATE WHILE PROVIDING COMPRESSION SUPPORT

(75) Inventors: Tz-Cheng Chiu, Plano, TX (US); Rajiv Carl Dunne, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 518 days.

(21) Appl. No.: 11/470,297

(22) Filed: Sep. 6, 2006

(65) Prior Publication Data

US 2007/0004083 A1  Jan. 4, 2007

Related U.S. Application Data

(62) Division of application No. 10/913,772, filed on Aug. 7, 2004, now Pat. No. 7,126,217.

(51) Int. Cl.
 *H01L 21/44* (2006.01)
(52) U.S. Cl. .................. 438/118; 438/121; 438/125
(58) Field of Classification Search ........... 438/106, 438/110, 116, 118, 121, 125; 257/704, 706, 257/726, 727
 See application file for complete search history.

(56) References Cited

U.S. PATENT DOCUMENTS

| | | | |
|---|---|---|---|
| 3,698,082 A | 10/1972 | Hyltin et al. | |
| 3,874,768 A | 4/1975 | Cutchaw | |
| 4,561,011 A | 12/1985 | Kohara et al. | |
| 5,326,611 A | 7/1994 | Kishita et al. | |
| 5,528,462 A * | 6/1996 | Pendse ................ | 257/778 |
| 5,666,272 A | 9/1997 | Moore et al. | |
| 5,931,222 A | 8/1999 | Toy et al. | |
| 5,949,137 A * | 9/1999 | Domadia et al. ........ | 257/712 |
| 6,037,193 A | 3/2000 | Interrante et al. | |
| RE37,082 E | 3/2001 | Butera | |
| 6,282,096 B1 * | 8/2001 | Lo et al. ............. | 257/706 |
| 6,294,408 B1 * | 9/2001 | Edwards et al. ........ | 438/121 |
| 6,507,103 B2 | 1/2003 | Yamaguchi et al. | |
| 6,743,026 B1 * | 6/2004 | Brodsky ............... | 439/73 |
| 6,747,350 B1 | 6/2004 | Lin et al. | |
| 6,825,429 B2 | 11/2004 | Dove et al. | |
| 6,888,239 B1 | 5/2005 | Kim | |
| 6,936,919 B2 | 8/2005 | Chuang et al. | |
| 6,979,782 B1 * | 12/2005 | Brodsky et al. ........ | 257/704 |
| 7,161,238 B2 * | 1/2007 | Hsieh et al. ........... | 257/704 |
| 7,372,147 B2 * | 5/2008 | Dai et al. ............. | 257/707 |

* cited by examiner

*Primary Examiner*—Kevin M Picardat
(74) *Attorney, Agent, or Firm*—Yingsheng Tung; Wade J. Brady, III; Frederick J. Telecky, Jr.

(57) ABSTRACT

In a semiconductor flip-chip package having a semiconductor die as part of a substrate assembly, a lid (or lid assembly) and substrate are supported to prevent tilting and teetering of the lid. The lid and substrate do not adhere, so as to reduce cracking of solder joints due to thermal cycling induced by repeated system power on-off. An adhesion prohibitor may be applied so that a support does not adhere to both lid and substrate; the support may be prevented from adhering to both lid and substrate by a separate curing step. The arrangements and fabrication methods may be applied to many package types, including ball grid array (BGA) and land grid array (LGA) packages.

11 Claims, 7 Drawing Sheets

ARRANGEMENT IN SEMICONDUCTOR PACKAGES FOR INHIBITING ADHESION OF LID TO SUBSTRATE WHILE PROVIDING COMPRESSION SUPPORT

This is a divisional application of co-pending application Ser. No. 10/913,772, filed Aug. 7, 2004.

BACKGROUND OF THE INVENTION

1. Field of the Invention

The invention relates to arrangements for inhibiting adhesion of the lid to the substrate (or interposer) in lidded semiconductor packages, and to methods for fabricating semiconductor packages having such arrangements.

2. Related Art

Conventional semiconductor flip-chip package arrangements include ball grid array (BGA) packages and land grid array (LGA) packages.

In a BGA package, a ceramic or organic substrate (or interposer) is connected to a semiconductor die by a suitable means such as an array of flip-chip solder bumps and an underfill material (for example, polymer). The substrate itself may have an array of solder balls to enable subsequent assembly of the package onto a printed circuit board (PCB). A lid, which may constitute or connect to a heat sink to dispel heat generated by the semiconductor die, may be adhered to the die by a suitable thermally-conductive adhesive.

In an LGA package, metal lands (or pads) on the substrate (interposer) mate and contact interconnects (metal spring or conductive polymer) in a socket.

In conventional BGA and LGA arrangements, the lid is adhered to the substrate by means of connecting elements, which may be made of a thermally conductive polymer. Connecting elements adhere to both lid and substrate by means of the same thermally-conductive polymer adhesive. The polymer used to adhere the die to the lid may be different from the polymer used to adhere the die to the substrate.

Unfortunately, in configurations such as the BGA package, board level reliability (BLR) performance under thermal cycling (TC) may be significantly reduced when the lid adheres to the substrate at the corner locations. This BLR performance reduction occurs because the various package components have different coefficients of thermal expansion (CTEs). With different CTEs, differential expansion and contraction of package components during low temperature-high temperature TC testing cause shearing deformation of the BGA solder balls or joints. These joints are where failures almost always occur. The magnitude of these solder joint shear deformations is maximum at the joints in the corner locations. This situation is exacerbated by the fact that the lid is coupled to the substrate at these corner locations.

Other conventional packages omit connecting elements associated with the BGA packages mentioned above. By not adhering lid to substrate, a significant improvement in BLR TC performance may be achieved—as much as 25-40%, based on finite element modeling and experimental testing. However, this arrangement has a problem in that, because the lid does not adhere to the substrate, the lid could be tilted after being placed atop die. A tilted lid is detrimental to mechanical reliability of the package, because during package electrical testing in a test socket, a plate/actuator applies force that causes pressure to be applied in a non uniform manner to the substrate, causing the substrate to crack. Such cracking is especially troublesome for low-temperature co-fired ceramic (LTCC) substrates, which have less flexural strength than high-temperature co-fired ceramic (HTCC) ceramics such as alumina.

A similar failure mode in both BGA and LGA packages, that of substrate cracking, is likely to occur also in high power semiconductor packages in which a heat sink is affixed to the PCB. In particular, compressive forces during affixing might crack the substrate. For example, in BGA arrangements, because force is transferred only through the die surface area, the force compresses the solder joints under the die, resulting in early shorted ball failure under use conditions when the solder exhibits creeping behavior under compression.

A tilted lid also affects thermal performance of packages. Heat dissipation ability of a flip-chip package depends on the thermal resistance between the lid and die, which is minimized by reducing the thickness of the bond line (the adhesive between semiconductor die and lid). A tilted lid causes non-uniform bond line thickness, which in turn may cause locally high thermal resistance for part of the die and degrade thermal performance of the package.

SUMMARY

The present inventors recognize a need to inhibit adhesion of the lid to the substrate, yet to provide support at locations where heat sink or socket compressive loads are applied, so as to achieve a robust and reliable package from both mechanical and thermal cycling board-level reliability standpoints.

The invention provides arrangements by which the lid (or lid assembly) and substrate (or substrate assembly) are supported with respect to each other so as to prevent tilting and teetering of the lid during socketing, testing, application of heat sinks, and so forth; yet the lid and substrate are not adhered, such that CTE-mismatch induced solder joint cracking can be delayed, to improve reliability.

In some embodiments, an adhesion prohibitor may be explicitly applied so that a support does not adhere to both lid and substrate; in other embodiments, the support may be prevented from adhering to both lid and substrate by a separate curing step.

The arrangements and fabrication methods may be applied to many package types, including ball grid array (BGA) and land grid array (LGA) packages.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which:

FIGS. 1A and 1C respectively illustrate conventional ball grid array (BGA) and land grid array (LGA) semiconductor flip-chip packages whose lid 110 is adhered to a substrate 102 by connecting elements 114A, 114B; and FIGS. 1B and 1D respectively illustrate conventional BGA and LGA semiconductor flip-chip packages whose lid 110 does not adhere to substrate 102;

DETAILED DESCRIPTION

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design, selection, and implementation of basic electronic elements and fabrication steps, lies within the ability of those skilled in the art, and accordingly any detailed discussion thereof may be omitted.

Figure 3A:
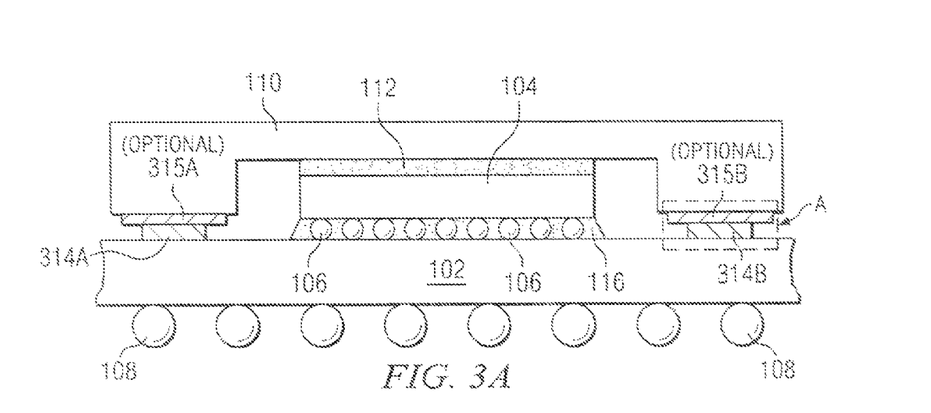
FIGS. 3A and 3B illustrate first and second BGA embodiments that avoid the problems inherent in the conventional arrangements in FIGS. 1A and 1B.
Figure 3B:
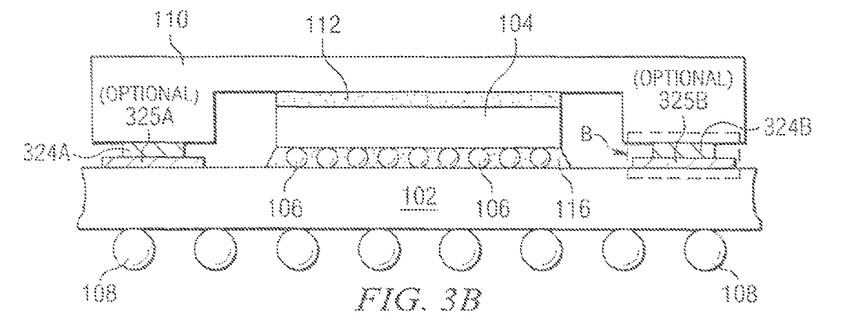

Referring now to FIGS. 3A and 3B, alternative embodiments of BGA semiconductor packages are illustrated. Substrate 102, die 104, solder bumps 106, solder balls 108, lid 110 and adhesive 112 may be constituted and arranged in the same manner as described above, with reference to FIGS. 1A and 1B. Accordingly, that description need not be repeated.

Figure 1A:
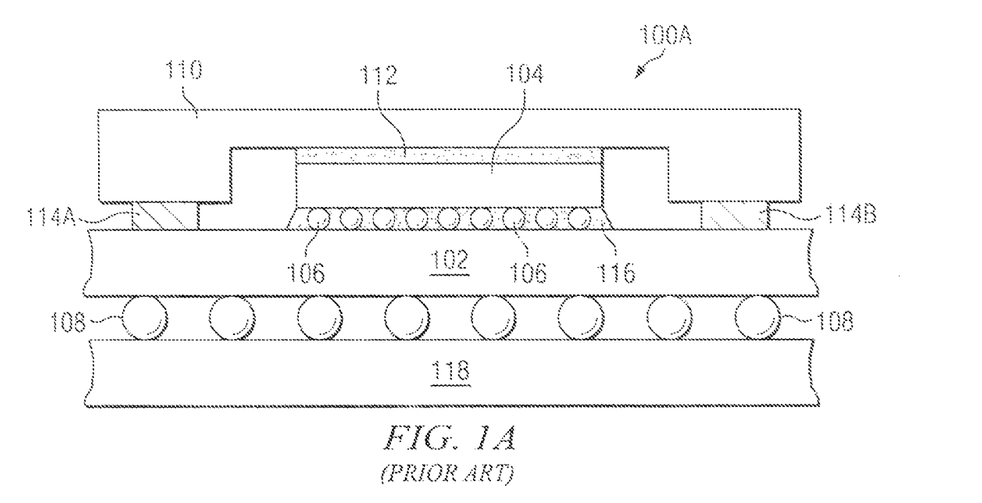
FIGS. 1A, 1B, 1C and 1D illustrate conventional semiconductor packages 100A, 100B, 100C, 100D having a substrate 102, semiconductor die 104, flip-chip solder bumps 106, solder balls 108, lid 110, thermally conductive lid-attach adhesive 112, connecting elements 114A, 114B (collectively, 114), underfill 116, heat sink 130; and either printed circuit board (PCB) 118, or metal lands (or pads) 120 with interconnects 122 and socket 124. More specifically.
Figure 1B:
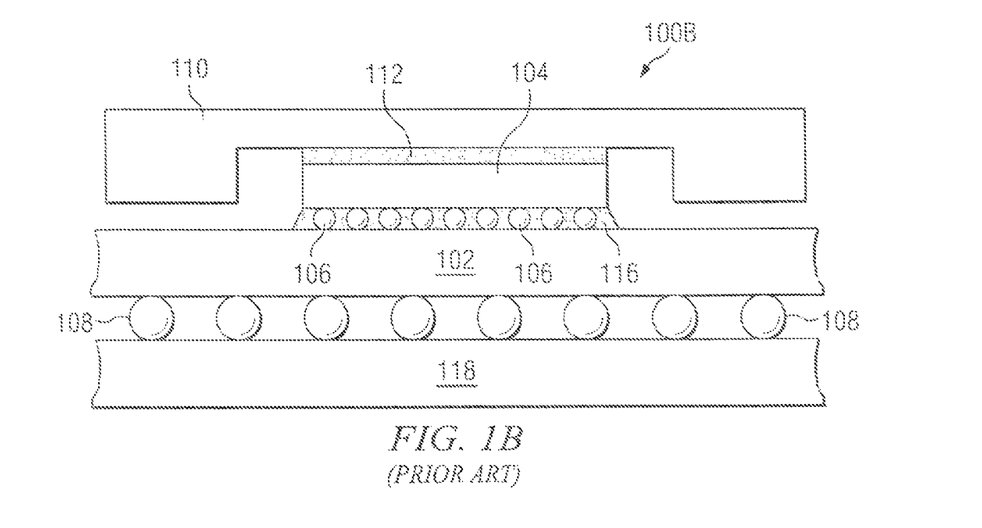

However, in FIG. 3A, supports 314A, 314B (collectively called 314) are provided in place of connecting elements 114A, 114B (FIG. 1A). Further, in FIG. 3B, supports 324A, 324B (collectively called 324) are provided in place of connecting elements 114A, 114B (FIG. 1A). Though the "supports" illustrated in cross-section may appear to be plural elements, they may in fact be parts of a single unitary support surrounding the die; thus supports 314A, 314B may be part of a single support 314, and supports 324A, 324B may be part of a single support 324.

The supports 314A, 314B (FIG. 3A) adhere to substrate 102, but not to lid 110. The supports 314A, 314B may be prohibited from adhering to lid 110 by an adhesion prohibitor 315A, 315B that is made of, for example, gold or Teflon.

Elements 315A, 315B may also be replaced with gaps G of arbitrary thickness (for example, less than 10 micrometer) (see FIG. 3G), down to zero thickness (see FIG. 3I), as discussed with reference to the fabrication processes of FIGS. 5A, 5B.

Conversely, the supports 324A, 324B (FIG. 3B; collectively called 324) adhere to lid 110 but not to substrate 102. The supports 324A, 324B may be prohibited from adhering to substrate 102 by an adhesion prohibitor 325A, 325B (collectively called 325) made of, for example, gold or Teflon.

Elements 325A, 325B may also be replaced with gaps G of arbitrary thickness (for example, less than 10 micrometer) (see FIG. 3H), down to zero thickness (see FIG. 3J), as discussed with reference to the fabrication processes of FIGS. 5A, 5B.

Thus, more generally, supports 314A, 314B, 324A, 324B are shown to be connected to one of substrate 102 and lid 110 but not to both. Further embodiments (not shown) involve some supports that adhere only to the substrate assembly and other supports that adhere only to the lid assembly. (As understood herein, the term "assembly" includes entities having only a single component; for example, a "lid assembly" is intended to encompass a unitary lid.)

Further, there may be interposed a gap G of arbitrary thickness (for example, less than 10 micrometer) (see FIGS. 3E, 3F), down to zero thickness (FIGS. 3A, 3B), between the support and any adhesion prohibitor that may be present.

Figure 5A:
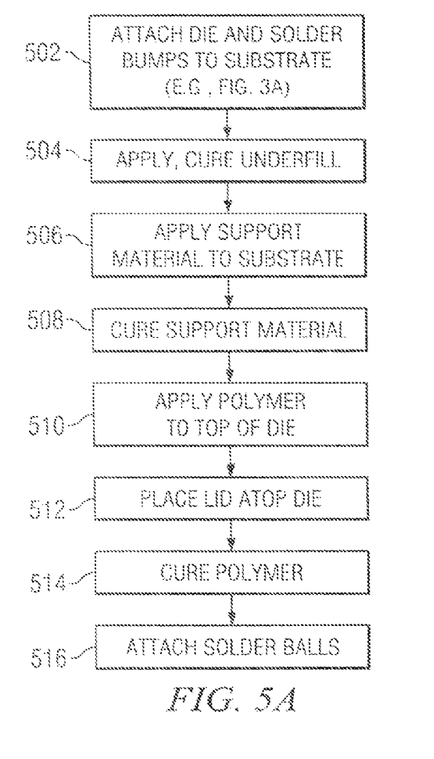
FIGS. 5A and 5B are flowcharts illustrating embodiments of assembly processes of the packages of FIGS. 3A and 3B, respectively, the processes not requiring an adhesion prohibitor.
Figure 5B:
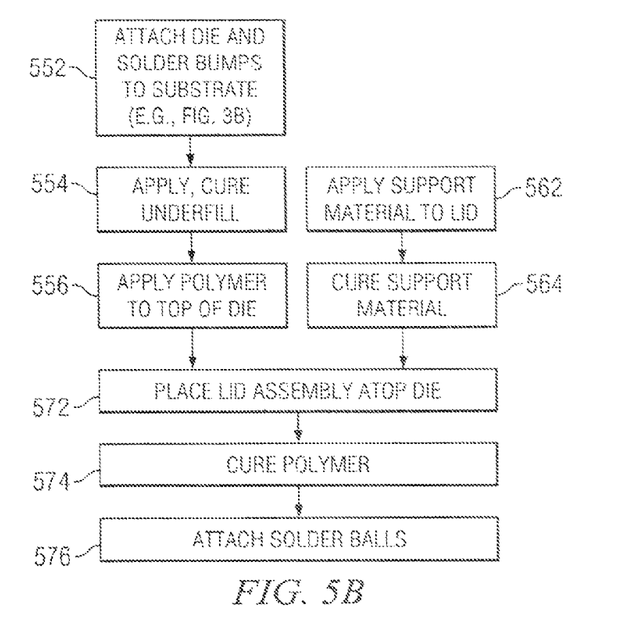

Stated more generally, the supports may be prevented from adhering to more than one of the substrate and lid, by means other than an explicitly deposited adhesion prohibitor (for example, by curing the support material before placing the lid atop the die (see FIGS. 5A, 5B). In such embodiments, adhesion prohibitors 315, 325 may be replaced a gap G of arbitrary thinness (see FIGS. 3G, 3H) down to zero thickness (see FIGS. 3I, 3J).

Advantageously, in these embodiments, the lid does not adhere to the substrate, and the board level solder joint reliability of the semiconductor package, driven by the coefficient of thermal expansion (CTE) and elastic modulus mismatch of the different materials in the package and PCB under system power on-off induced thermal cycling, is significantly improved over the arrangement shown in FIG. 1A.

Figure 2A:
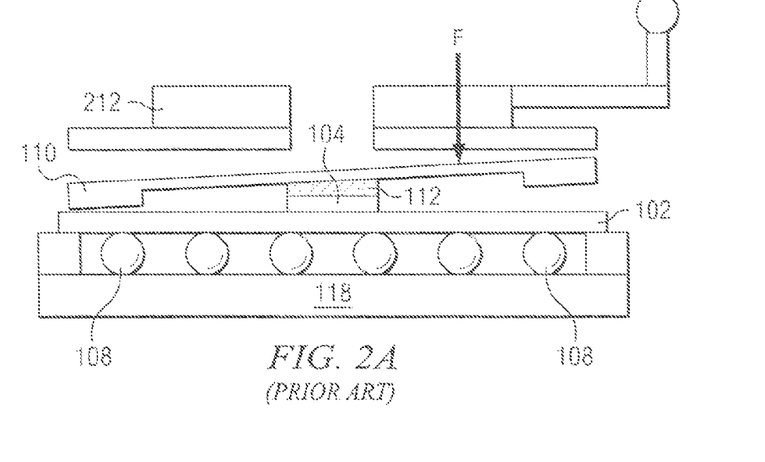
FIGS. 2A and 2B illustrate two scenarios in which the arrangements of FIG. 1B and FIG. 1D (with or without a tilted lid) may apply non-uniform pressure on the substrate and/or the die (for example, by plate/actuator 212 or heat sink 130), thereby cracking the die or substrate and causing package failure.
Figure 2B:
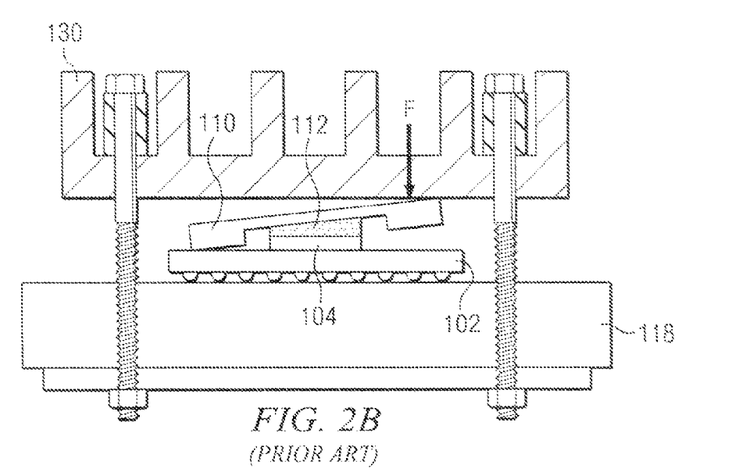

Furthermore, with supports 314A, 314B, 324A, 324B, the following advantages of mechanical reliability are realized. First, there is a reduction in an out-of-specification value of lid tilt after the lid-adherence process (lid tilt can result in die or substrate cracking due to non-uniform application of pressure during electrical test, package socketing, or heat-sink attachment). Second, there is a reduction in solder joint failures due to solder ball shorting to neighboring solder balls under the compressive load applied through any heat-sink attachment, because the load is applied more uniformly from lid to substrate with the supports as opposed to just concentrating on the die top area. By implication, because lid 110 is prevented from tilting, heat sink 130, resting upon the lid, is also prevented from tilting (compare FIG. 2B).

The components of the embodiments shown in FIGS. 3A and 3B may be made and arranged in accordance with principles known to those skilled in the art. The adhesion prohibitors 315A, 315B, 325A, 325B may be made of, for example:

TEFLON® coatings (products from Dupont, Whitford, for example);

TEFLON® or silicone in some other polymer matrix (WEARLON™, a silicone in epoxy matrix from Eccotech, Inc., for example);

TEFLON®—filled ceramic coatings (CERM-A-LON™, from SermaTech);

self-bonding non-stick silicone-based polymer coatings (KISS-COTE®, from Kiss-Cote, Inc.);

Gold plating;

chrome plating (Armoloy, from Armoloy Corporation);

any other suitable adhesion prohibitor material(s), individually or in combination;

a gap (that is, no solid material adhesion prohibitor) of arbitrarily small thickness (for example, less than 10 micrometers), or even no gap.

The foregoing list illustrates that the advantages of not adhering the lid to the substrate may be achieved by including only a support 314A, 314B, 324A, 324B, without a material adhesion prohibitor 315A, 315B, 325A, 325B. For example, a thin gap not filled with solid material may constitute the "adhesion prohibitor" 315A, 315B, 325A, 325B (see FIGS. 3G, 3H and 3I, 3J). In this event, the support directly faces the lid (FIG. 3A) and the substrate (FIG. 3B), but without adhering thereto. Any gap G between the support and either the lid (FIG. 3G) and the substrate (FIG. 3H) may be of diminishingly small thickness, to even zero thickness (FIGS. 3I, 3J), so as to controllably limit any teetering that the lid 110 may experience atop die 104.

Figure 1C:
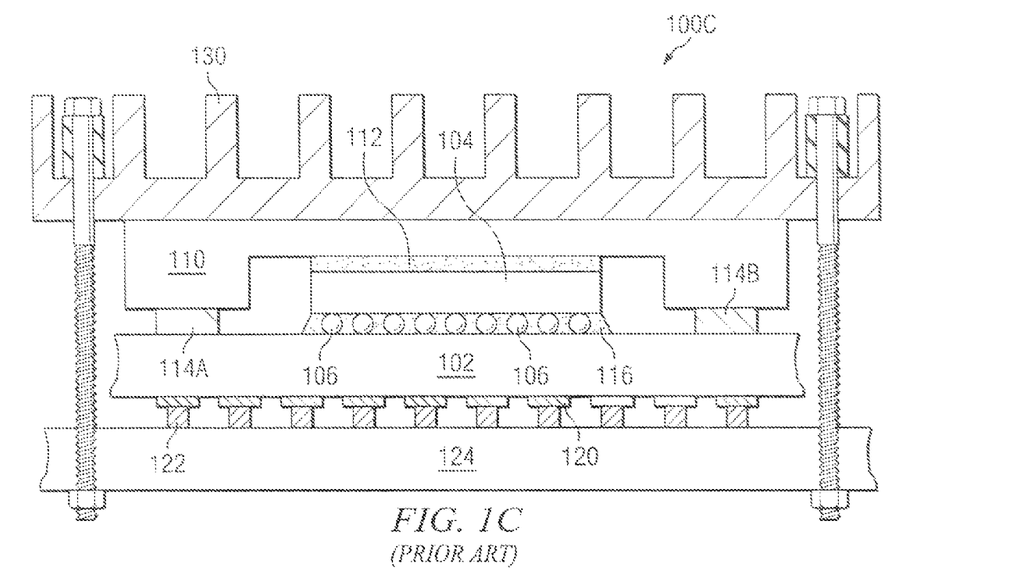
Figure 1D:
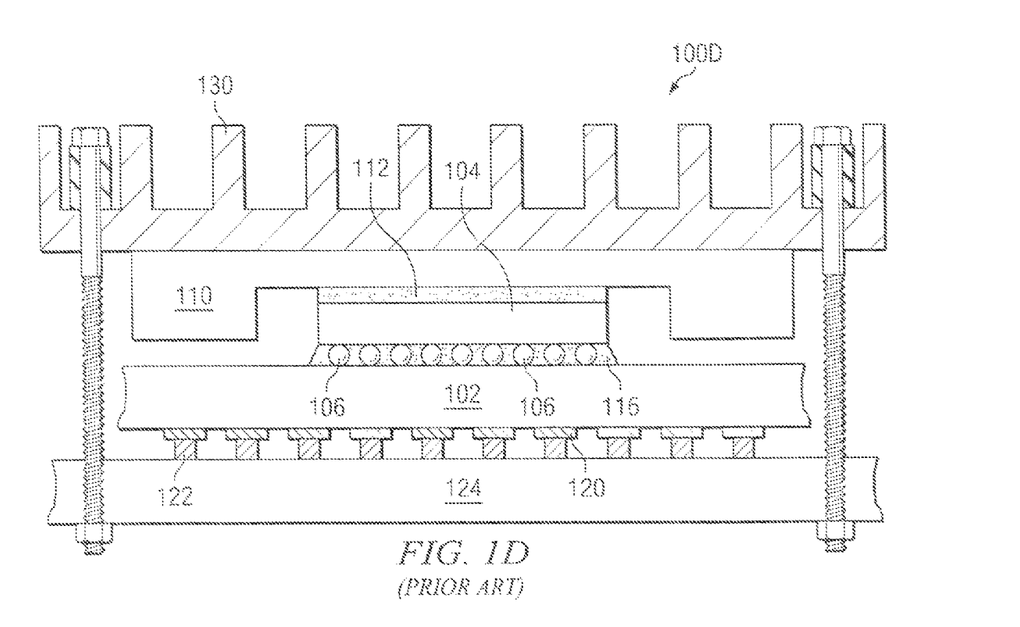
Figure 3C:
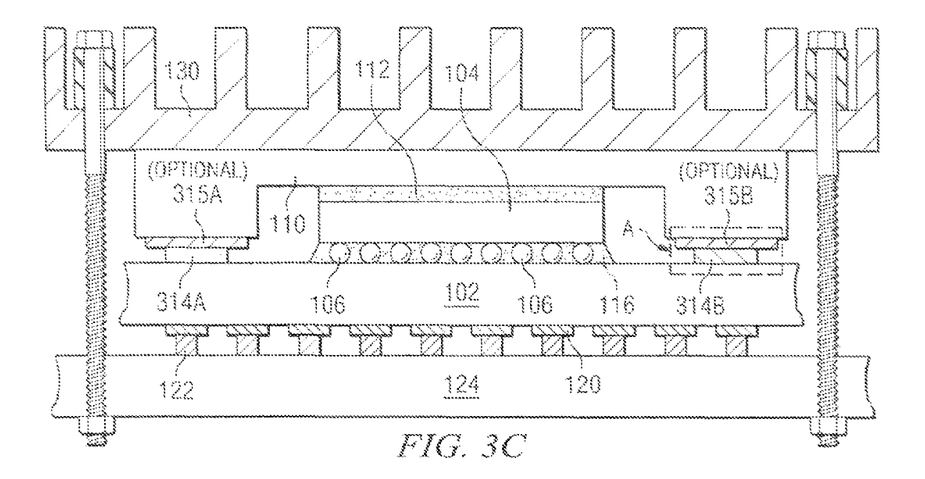
FIGS. 3C and 3D illustrate first and second LGA embodiments that avoid the problems inherent in the conventional arrangements in FIGS. 1C and 1D.
Figure 3D:
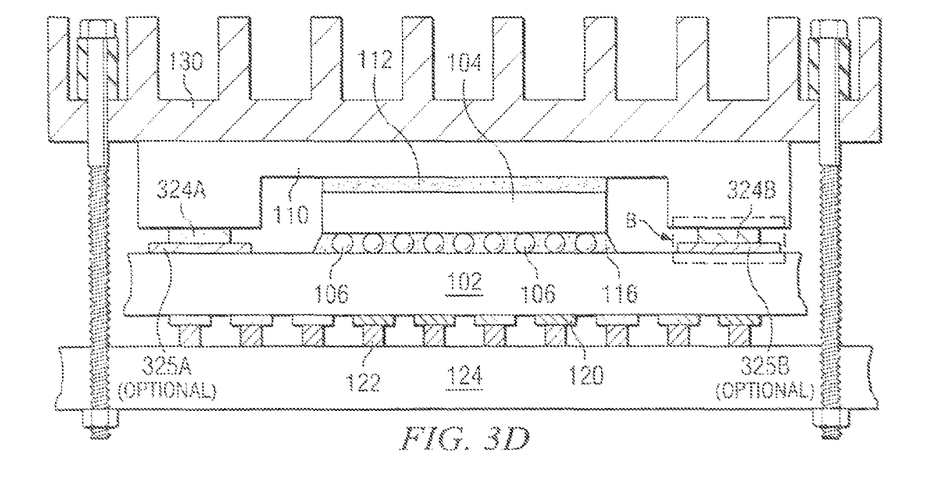
Figures 3E, 3F, 3G:
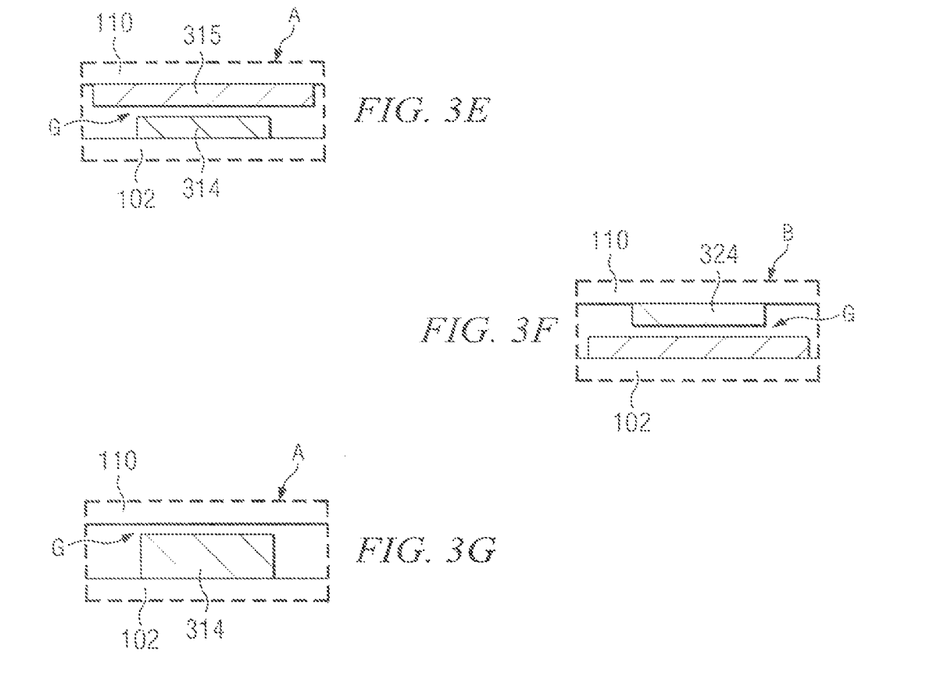
FIGS. 3E and 3F illustrate examples of blow-ups of portions A and B from FIGS. 3A and 3B, respectively, that show a gap G between the support and adhesion prohibitor.
FIGS. 3G and 3H illustrate further examples of blow-ups of portions A and B from FIGS. 3A and 3B, respectively, that show a gap G between the support and the lid (FIG. 3G) or between the support and the substrate (FIG. 3H), this embodiment having no explicitly deposited adhesion prohibitor.
Figure 3H:
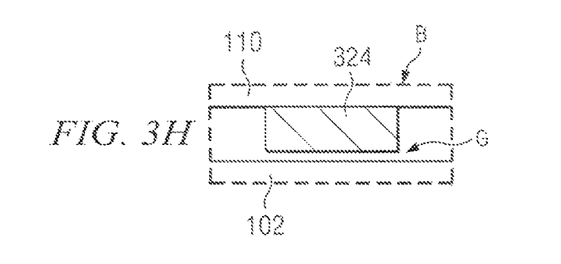
Figure 3I:
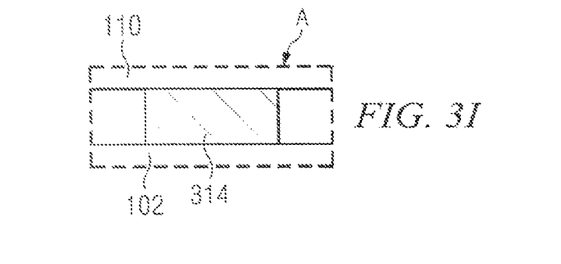
FIGS. 3I and 3J illustrate still further examples of blow-ups of portions A and B from FIGS. 3A and 3B, respectively, that show the support adhering to only one of the substrate and lid, but being in non-adhesive contact with the other of the substrate and lid.

FIGS. 3C and 3D illustrate first and second LGA embodiments that avoid the problems inherent in the conventional arrangements in FIGS. 1C and 1D. These LGA embodiments are included to emphasize that the BGA embodiments shown in FIGS. 3A and 3B are merely examples of how supports may adhere to only one of the lid and substrate, in a variety of semiconductor package types and approaches. The invention may be applied to other than BGA and LGA embodiments, as well.

The packages of FIGS. 3C, 3D include supports 314A, 314B, 324A, 324B that may be composed, structured and arranged in the same manner as the like-numbered elements in FIGS. 3A, 3B. Likewise, the packages of FIGS. 3C, 3D may include adhesion prohibitors 315A, 315B, 325A, 325B (or gaps, not including adhesion prohibitors) that may be composed, structured and arranged in the same manner as the like-numbered elements in FIGS. 3A, 3B. Accordingly, a repetitious description thereof need not be included.

Thus, the described embodiments relate to arrangements for inhibiting adhesion of a lid to a substrate/interposer, especially in lidded flip-chip semiconductor packages, so as to achieve at least the following improvements:

i) an improvement in the board-level reliability thermal cycling performance by not adhering the lid to the substrate/interposer—especially beneficial to ball grid array (BGA) packages, and ii) an improvement in board-level mechanical reliability performance by reducing or eliminating lid tilt—beneficial to both BGA and land grid array (LGA) flip-chip packages.

Figure 4A:
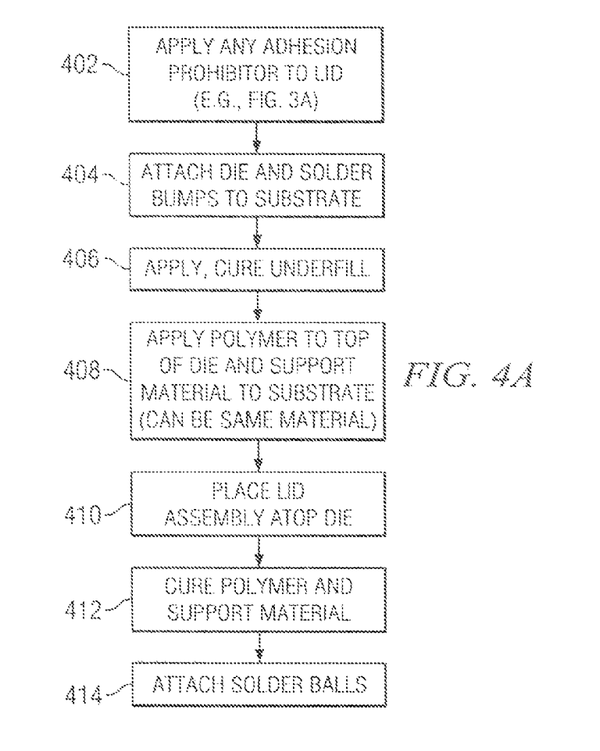
FIGS. 4A and 4B are flowcharts illustrating embodiments of assembly processes of the packages of FIGS. 3A and 3B, respectively, processes that permit there to be only a single curing step for the lid-adhesion polymer and the support material.
Figure 4B:
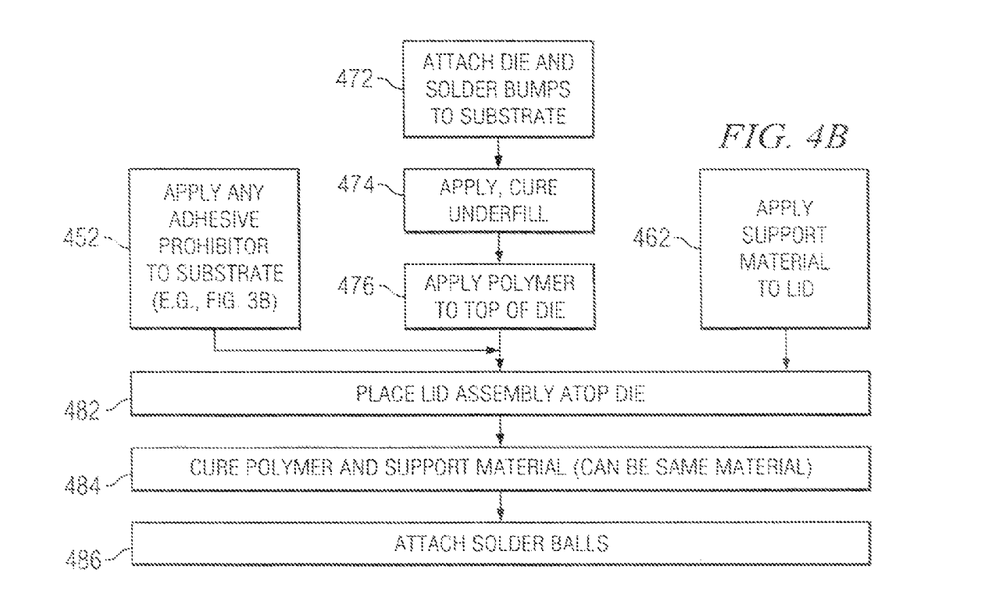

FIGS. 4A and 4B are flowcharts illustrating embodiments of assembly processes of the packages of FIGS. 3A and 3B, respectively, processes that permit there to be only a single curing step for the lid-adhesion polymer and the support material.

Referring to FIG. 4A, block 402 indicates application of any adhesion prohibitor 315 to the lid 110. Again, it is understood that not all embodiments require application of an adhesion prohibitor.

Block 404 indicates attachment of the die 104 and solder bumps 106 to the substrate 102.

Block 406 indicates application and curing of underfill 116 beneath the die 104.

Block 408 indicates application of polymer (or other lid-attach adhesive) 112 to the top of die 104. Block 408 also indicates application of support material 314 to the substrate. Block 408 is illustrated as applying both the polymer 112 and support material 314 as a common step, recognizing that the two materials may be the same material. However, it is explicitly recognized that the two materials may also be different, and may be applied in separate steps if desired.

Block 410 indicates placement of the lid assembly (lid 110 plus any adhesion prohibitor 315) atop the die. At this time, the lid is adhered to the top of the die by polymer 112. Meanwhile, the geometry of supports 314 and any adhesion prohibitor 315 prevent the lid from tilting or teetering, while preventing adhesion of lid 110 to substrate 102.

Block 412 indicates the curing of the lid-attach adhesive (polymer) 112 and the support material 314. Advantageously, this curing may be accomplished in a single curing step, which is especially useful when the polymer and support material are the very same material.

Finally, block 414 indicates attachment of solder balls 108 to the substrate 102.

The steps of FIG. 4A are illustrated as sequential steps; however, it understood that some of the steps may be performed in a different order, or contemporaneously, with other steps. For example, step 402 (lid assembly) may be performed contemporaneously with or subsequent to steps 404, 406, 408 (substrate assembly).

At the termination of FIG. 4A (also FIGS. 4B, 5A, and 5B), the package is considered fully assembled. Thereafter, the assembled semiconductor package may be tested in sockets (such as element 124 in FIGS. 3C, 3D). Thereafter, the package may be affixed to a printed circuit board 118 (see FIGS. 1A, 1B) and a heat sink 130 (see FIG. 2B) may be applied.

Many of the features and advantages described with reference to FIG. 4A are understood to apply to the processes of FIGS. 4B, 5A and 5B; for brevity, such features and advantages are generally not repeated in the following description.

FIG. 4B illustrates an embodiment of a process of fabricating a BGA package (see FIG. 3B) in which the support material 324 adheres to lid 110 (rather than to substrate 102 as in the method of FIG. 4A).

Referring to FIG. 4B, block 452 indicates application of any adhesive prohibitor 325 to substrate 102 (see, for example, FIG. 3B). Various embodiments do not require use of an adhesion prohibitor (see, for example, FIGS. 5A, 5B).

Block 462 indicates application of support material 324 to lid 110 (compare block 408).

Block 472 indicates attachment of the die 104 with solder bumps 106 to the substrate (see block 404).

Block 474 indicates application and curing of underfill 116 beneath the die 104 (see block 406).

Block 476 indicates the application of polymer (or other adhesive 112) to the top of die 104 (compare block 408).

Block 482 indicates placement of the lid assembly (lid 110 and support 324) atop die 104 (compare block 410). At this time, the lid is adhered to the top of the die by polymer 112. Meanwhile, the geometry of supports 324 and any adhesion prohibitor 325 prevent the lid from tilting or teetering, while preventing adhesion of lid 110 to substrate 102.

Block 484 indicates the curing of lid-attach adhesive (polymer) 112 and support material 314 (compare block 412). Advantageously, this curing may be accomplished in a single curing step, which is especially useful when the polymer and support material are the very same material.

Block 486 indicates attachment of solder balls 108 to the substrate 102 (see block 414).

The steps of FIG. 4B are illustrated as sequential steps, and as sets of steps that may be executed in parallel. However, it understood that certain sequentially-illustrated steps may be performed in a different order, or contemporaneously, with other steps. Likewise, certain steps indicated as being executed in parallel may be performed sequentially.

FIGS. 5A and 5B are flowcharts illustrating embodiments of assembly processes of the packages of FIGS. 3A and 3B, respectively, processes that do not involve an adhesion prohibitor 315, 325. Instead an adhesion prohibitor, a gap of arbitrarily small size (for example, less than 10 micrometers), down to zero thickness, may be formed to ensure that the support material 314, 324 adheres to only one of the lid 110 or substrate 102.

Referring to FIG. 5A, block 502 indicates attachment of the die 104 and solder bumps 106 to the substrate 102 (see block 404).

Block 504 indicates application and curing of underfill 116 beneath the die 104 (see block 406).

Block 506 indicates application of support material 314 to substrate 102 (compare block 408).

Block 508 indicates curing of the support material 314 that has been applied to the substrate (compare block 412). Curing at this time ensures the support will not adhere to the lid.

Block 510 indicates application of lid-attach adhesive (polymer) 112, such as polymer, to the top of die 104 (compare block 408).

Block 512 indicates placement of the lid 110 (or any lid assembly) atop die 104, being adhered to it by the lid-attach adhesive (polymer) 112 (compare block 410). At this time, support material 314 prevents the lid 110 (or lid assembly) from tilting or teetering atop the die 104.

Block 514 indicates curing of the lid-attach adhesive (polymer) 112, such as polymer (compare block 412).

Finally, block 516 indicates attachment of solder balls 108 to the substrate 102 (see block 414).

The methods of FIGS. 5A, 5B differ from those of FIGS. 4A, 4B in that FIGS. 5A, 5B do not involve an explicitly applied adhesion prohibitor 315, 325, but instead cure the support material 314, 324 in a curing step that is separate from the curing of lid-adhesive 112 (for example polymer).

Referring now to FIG. 5B (a method of fabricating FIGS. 3H, 3J, for example), block 552 indicates attachment of the die 104 with solder bumps 106 to the substrate (see block 472).

Block 554 indicates application and curing of underfill 116 beneath the die 104 (see block 474).

Block 556 indicates application of polymer (or other adhesive 112) to the top of die 104 (see block 476).

Block 562 indicates application of support material 324 to lid 110 (see block 462).

Block 564 indicates curing of the support material that has just been applied to the lid. This curing step occurs before the lid assembly is adhered to the die. In the FIG. 5B process, this curing step is separate from the subsequent curing of lid-attach adhesive (polymer) 112 (compare block 484).

Block 572 indicates placement of the lid assembly (110, 324) atop die 104 (compare block 482), the lid assembly adhering to the die by the lid-attach adhesive (polymer) applied in block 556. At this time, supports 324 ensure that the lid assembly does not tilt or teeter atop the die.

Block 574 indicates curing of the lid-attach adhesive (polymer) 112 (compare block 484). In FIG. 5B, this curing step is separate from the support material curing step 564.

Finally, block 576 indicates attachment of solder balls 108 to the substrate 102 (see block 486).

The steps of FIG. 5B are illustrated as sequential steps and as sets of steps that may be executed in parallel. However, it understood that certain sequentially-illustrated steps may be performed in a different order, or contemporaneously, with other steps. Likewise, certain steps indicated as being executed in parallel may be performed sequentially.

The methods of FIGS. 4A, 4B, 5A, 5B happen to focus on the BGA embodiment. However, it is understood that the method may be adapted and applied to LGA and other package types.

The foregoing description supports a semiconductor package (see FIG. 3A) including a semiconductor die (104), the package having a lid (110) that adheres to the semiconductor die (104); an adhesion prohibitor (315 in FIG. 3A) that adheres to the lid; a substrate assembly (102 ...) that bears the semiconductor die (104); and a support (314) that adheres to the substrate assembly (102 ... ), and that is in contact with the adhesion prohibitor (315), which prevents the support from adhering to the lid so that the lid and substrate assembly may expand and contract independently at different expansion and different contraction rates during thermal cycling, the support limiting a tilt of the lid with respect to the semiconductor die and supporting the lid with respect to the substrate assembly.

Figure 3J:
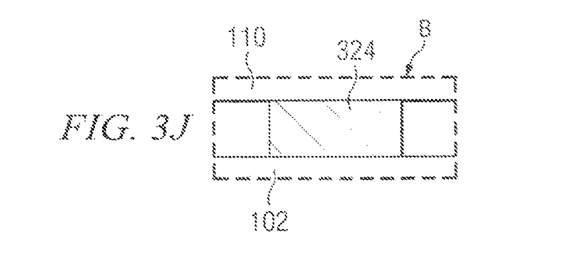

The foregoing description further supports a semiconductor package (FIGS. 3A ... 3J) including a semiconductor die (104), the package having a lid (110) that adheres to the semiconductor die; a substrate assembly (102 ... ) that bears the semiconductor die; and a support (314 or 324) that adheres to only one and not another of the substrate assembly and the lid, and limiting a tilt of the lid with respect to the substrate assembly.

The support may adhere to the substrate assembly but not to the lid.

The support may adhere to the lid but not to the substrate assembly.

The support, and the one of the substrate assembly and the lid to which the support does not adhere, may be directly opposed across a gap.

The gap may be on the order of 10 micrometers.

The support, and the one of the substrate assembly and the lid to which the support does not adhere, may be in non-adhesive contact.

The package may further have an adhesion prohibitor (315 or 325), interposed between the support and a one of the substrate assembly and the lid to which the support does not adhere.

The adhesion prohibitor and the support may be separated by a gap.

The gap may be on the order of 10 micrometers.

The substrate assembly may constitute one of a ball grid array (BGA) package and a land grid array (LGA) package.

The foregoing description further supports a method (see FIG. 4A) of fabricating a semiconductor package (FIG. 3A) including a lid (110) that adheres to a semiconductor die (104), and a substrate (102) assembly that bears the semiconductor die. The method may involve applying (402) an adhesion prohibitor (315) to the lid (110) to form a lid assembly; applying (408) an adhesive (112) atop the semiconductor die (104); adhering (408) to the substrate assembly (102), a support (314) where it will be opposite the adhesion prohibitor (315); placing (410) the lid assembly atop adhesive on the semiconductor die so that the adhesion prohibitor prevents the support from adhering to the lid so that the lid and substrate assembly may expand and contract independently at different expansion and different contraction rates during thermal cycling, the support limiting a tilt of the lid with respect to the semiconductor die and supporting the lid with respect to the substrate assembly; and in a single curing step (412), curing both the support and the adhesive that adheres the lid to the semiconductor die.

The foregoing description further supports a method of fabricating a semiconductor package (see FIG. 3A) including a lid (110) that adheres to a semiconductor die (104), and a substrate (102) assembly that bears the semiconductor die. The method may involve adhering a support (314 or 324) to only one and not another of the substrate assembly and the lid, so that the support limits a tilt of the lid with respect to the substrate assembly.

The support adhering step may include adhering the support to the substrate assembly but not to the lid.

The support adhering step may include adhering the support to the lid but not to the substrate assembly.

The support adhering step may include adhering the support across from the one of the substrate assembly and the lid to which the support does not adhere, across a gap.

The gap may be on the order of 10 micrometers.

The method may further involve ensuring that the support, and the one of the substrate assembly and the lid to which the support does not adhere, are in non-adhesive contact.

The method may further involve applying an adhesion prohibitor (315 or 325) between the support and a one of the substrate assembly and the lid to which the support does not adhere.

The method may further involve ensuring the adhesion prohibitor and the support are separated by a gap.

The gap may be on the order of 10 micrometers.

The substrate assembly may constitute one of a ball grid array (BGA) package and a land grid array (LGA) package.

Many alternatives, modifications, and variations will be apparent to those skilled in the art in light of the above teachings. For example, the choice of component materials, their dimensions, their interconnections, their assembly schemes, and so forth, other than those specifically disclosed herein, lies within the scope of the present invention. Moreover, the ordering of assembly steps, and the choice of whether to perform the steps serially or in parallel, may be varied while still remaining within the scope of the invention. It is therefore to be understood that within the scope of the appended claims and their equivalents, the invention may be practiced otherwise than as specifically described herein.

What is claimed is:

1. A method of fabricating a semiconductor package including a lid that adheres to a semiconductor die, and a substrate assembly that bears the semiconductor die, the method comprising:

applying an adhesion prohibitor to the lid to form a lid assembly;

applying an adhesive atop the semiconductor die;

adhering to the substrate assembly, a support where it will be opposite the adhesion prohibitor;

placing the lid assembly atop adhesive on the semiconductor die so that the adhesion prohibitor prevents the support from adhering to the lid so that the lid and substrate assembly may expand and contract independently at different expansion and different contraction rates during thermal cycling, the support limiting a tilt of the lid with respect to the semiconductor die and supporting the lid with respect to the substrate assembly; and in a single curing step, curing both the support and the adhesive that adheres the lid to the semiconductor die.

2. A method of fabricating a semiconductor package including a lid that adheres to a semiconductor die, and a substrate assembly that bears the semiconductor die, the method comprising:

adhering a support to only one and not another of the substrate assembly and the lid, so that the support limits a tilt of the lid with respect to the substrate assembly.

3. The method of claim 2, wherein the support adhering step includes:

adhering the support to the substrate assembly but not to the lid.

4. The method of claim 2, wherein the support adhering step includes:

adhering the support to the lid but not to the substrate assembly.

5. The method of claim 2, wherein the support adhering step includes:

adhering the support across from the one of the substrate assembly and the lid to which the support does not adhere, across a gap.

6. The method of claim 5 wherein:

the gap is on the order of 10 micrometers.

7. The method of claim 2, further comprising:

ensuring that the support, and the one of the substrate assembly and the lid to which the support does not adhere, are in non-adhesive contact.

8. The method of claim 2, further comprising:

applying an adhesion prohibitor between the support and a one of the substrate assembly and the lid to which the support does not adhere.

9. The method of claim 8, further comprising:

ensuring the adhesion prohibitor and the support are separated by a gap.

10. The method of claim 9, wherein:

the gap is on the order of 10 micrometers.

11. The method of claim 2, wherein the substrate assembly constitutes one of a ball grid array (BGA) package and a land grid array (LGA) package.

* * * * *